United States Patent [19]

Witt et al.

[11] 4,365,005

[45] Dec. 21, 1982

[54] METHOD OF FORMING A LAMINATED RIBBON STRUCTURE AND A RIBBON STRUCTURE FORMED THEREBY

[75] Inventors: August F. Witt, Winchester, Mass.; Ramaswamy V. Raman, Columbus, Ohio

[73] Assignee: Massachusetts Institute of Technology, Cambridge, Mass.

[21] Appl. No.: 126,762

[22] Filed: Mar. 3, 1980

Related U.S. Application Data

[62] Division of Ser. No. 950,965, Oct. 13, 1978, Pat. No. 4,229,231.

[51] Int. Cl.³ .................. B32B 15/04; C23C 1/00; H01F 1/04
[52] U.S. Cl. .................. 428/611; 118/412; 136/252; 136/261; 428/620; 428/641; 428/642; 428/646; 428/648; 428/649; 428/900; 428/939; 428/212

[58] Field of Search .............. 428/212, 900, 620, 939, 428/641, 642, 646, 648, 649, 611

[56] References Cited

U.S. PATENT DOCUMENTS 3,089,196 5/1963 Knapp et al. .
4,229,231 10/1980 Witt et al. .

Primary Examiner—James C. Cannon
Attorney, Agent, or Firm—Arthur A. Smith, Jr.; Thomas J. Engellenner

[57] ABSTRACT

A method of forming, by melt-spinning techniques, a laminated ribbon structure consisting, for example, of a semiconductor disposed on a metal ribbon substrate. The substrate may be 10-50 $\mu$m thick and the semiconductor may be 10-50 $\mu$m thick, for example; typically the ribbon width is about one millimeter to several centimeters.

11 Claims, 4 Drawing Figures

METHOD OF FORMING A LAMINATED RIBBON STRUCTURE AND A RIBBON STRUCTURE FORMED THEREBY

The Government has rights in this invention pursuant to Grant No. 7680895-DMR and Institutional Patent Agreement No. 0010, awarded by the National Science Foundation.

This is a division of Ser. No. 950,965, filed Oct. 13, 1978, now U.S. Pat. No. 4,229,231, and is being filed to comply with a requirement for restriction in the earlier application.

The present invention relates to methods of forming ribbons using melt-spinning techniques and to the articles formed thereby.

By way of background, attention is called to U.S. Pat. Nos. 2,900,708 (Pond) and 2,907,082 (Pond); a note entitled "A Method of Producing Rapidly Solidified Filamentory Castings" (Pond et al) *Transactions AIME*, Vol. 245, Nov. 1969, pp. 2475-6, and journal articles entitled "Metallic Glasses (Gilman), Physics Today, May 1975, pp. 46-53; "On the Formation of Laminated Semiconductor — Amorphous Metal Ribbon By Melt-Spinning Technique" (Witt et al); a paper entitled "Metallic Glasses — principles of Fabrications" (Kavesh), A.S.M., 1976 Materials Science Seminar, Niagara Falls, N.Y., Sept. 18, 1976; and an announcement entitled "An Experimental Method for The Casting of Rapidly Quenched Filaments and Fibers," (Maringer et al), Battelle Development Corporation.

Semiconductor ribbons, particularly silicon ribbons, hold promise of a low-cost material for photovoltaic applications. Several techniques for producing metallic ribbons are included in the above patents and writings. Ultra-high cooling rates have been achieved by using techniques in said Pond et al note. Ribbons formed using such techniques made by the present inventors were typically twenty micrometers in thickness, about one millimeter wide and several meters long. Cooling rates as high as $10^{6°}$ C./second were achieved (see Grant et al U.S. Pat. No. 4,084,964 on high rates of cooling in another context); but semiconductor ribbons so formed are quite brittle and break into small pieces about a few centimeters in length.

Accordingly, it is one of the principal objects of the present invention to provide a ribbon which is mechanically stable.

Another object is to provide ribbon wherein a portion thereof is formed of a semiconductor material.

The present inventors have found that such mechanical stability can be achieved in a semiconductor ribbon and its semiconducting properties can be unaffected by forming a ribbon as a multi-layered structure wherein one or more layers are a semiconductor material (i.e., an electronically active layer) and one or more layers are formed of a ductile material at least one of which constitutes a substrate. Still another object, therefore, is to provide such a ribbon in the form of a multi-layered structure.

Another object is to provide intimate contact between the electronically active layer and the substrate in such a way that uncontrolled contamination of the interface, substrate-active layer, is minimized and that a reproducible ohmic contact or a Schottky barrier is formed.

The ribbon is formed on the surface of a drum or other device which often adversely affects the ribbon. A still further object is to eliminate any adverse effects of the moving heat sink (drum or some other device) on the structure and purity of the electronic (or other) material deposited.

These and still further objects are addressed hereinafter.

The foregoing objects are achieved by a method of forming a ribbon structure (and the ribbon structure formed thereby) by rapid solidification of a melt wherein a first melt is deposited upon a fast moving surface and simultaneously depositing upon the first melt a second melt which quickly forms a solid layer. The method described in greatest detail involves depositing a first melt upon a fast moving surface where the first melt quickly cools to form a first solid layer which can be ductile; a second melt is deposited on the first solid layer, quickly cooling to form a second solid layer that can be brittle. It will be seen in the explanation hereinafter that the depositing of the first melt and the second melt occur simultaneously in time but are spatially removed from one another. It will also be shown that the cooling, particularly of the second melt, must be sufficiently fast so that the resulting solid is not contaminated by diffusion from the first solid. Additional solid layers may be formed in the manner just noted, to provide a ribbon composed of several layers.

The invention is hereinafter described with reference to the accompanying drawing in which.

Figure 3:
FIGS. 3 and 4 are photomicrographs (respectively x916 and x821) showing the interfaces of two multi-layered ribbons formed using the present techniques.
Figure 4:

The apparatus used by the present inventors is a modified version of that described in the Pond et al note. Details of the experimental arrangement of Pond et al are to be found in the inventor Raman's doctoral thesis (Northeastern University, Boston, Massachusetts, Dec. 1977). The teaching herein, as distinguished from Pond et al, employs a plurality of nozzles, whose output orifices are spatially separated from one another and whose temperatures may be independently controlled, to deposit simultaneously a plurality of melts, spaced from one another, one melt being deposited upon the other to form, when the melts solidify, a multi-layered structure. Briefly, in preferred form, as indicated, the ultimate structure formed in accordance with the present invention is a multi-layered ribbon structure of the type shown in either FIG. 3 or FIG. 4, for example. Typically the ribbon consists of two layers, but it may have more.

Figure 1:
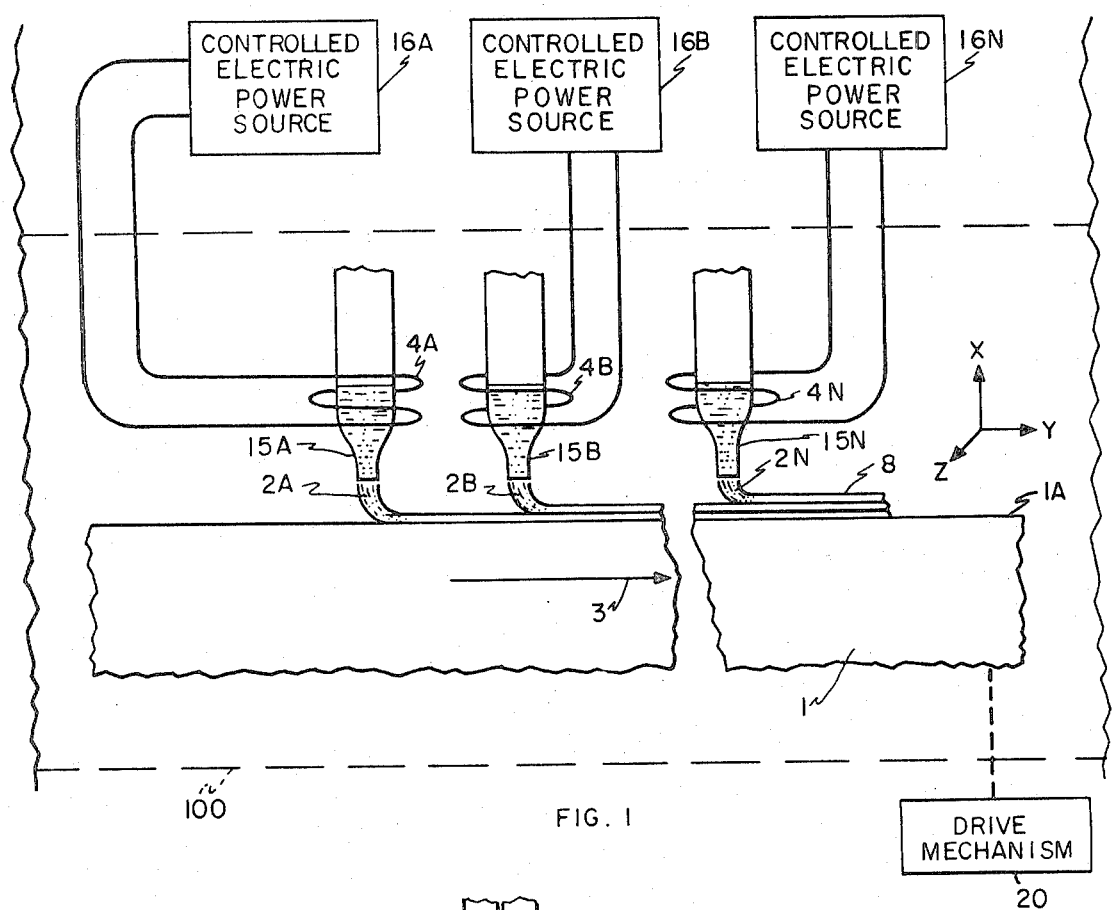
FIG. 1 is a diagrammatic side-view representation of apparatus adapted to perform the present method.

As shown in FIG. 1, a multi-layered solid ribbon 8 is formed on a fast-moving, heat extracting surface 1A of a drum or the like that is driven by a drive mechanism 20 to move in the direction of the arrow labeled 3 (i.e., the y-direction in FIG. 1). A first melt 2A, a second melt 2B..., and Nth melt 2N are simultaneously deposited on the moving surface 1A from delivery orifices, (e.g., about capillary size or larger and round or rectangular in shape) of nozzles 15A, 15A ... 15N, respectively, closely spaced from one another in the y-direction to form thereon the multi-layered ribbon 8. The material in the nozzles 15A ... 15N is kept in a molten state by heating coils 4A, 4B ... 4N respectively energized by controlled electric power sources 16A, 16B ... 16N. The x-direction in FIG. 1 (as well as in FIG. 2)

is vertical; each of the melts 2A, 2B . . . flows vertically downward in the form of a coherent liquid stream to form the multi-layered ribbon 8. Ribbon formation occurs in a chamner 100 in a controlled atmosphere which may be a vacuum or an inert or reactive gas environment, depending on the requirement with respect to the ribbon formed. The temperatures of the melts, ejection rates thereof, spacing of the nozzle orifices, and the speed of the moving surface 1A can be appropriately modified to control the microstructure of the ribbon 8, its layer thicknesses, and so forth.

Figure 2:
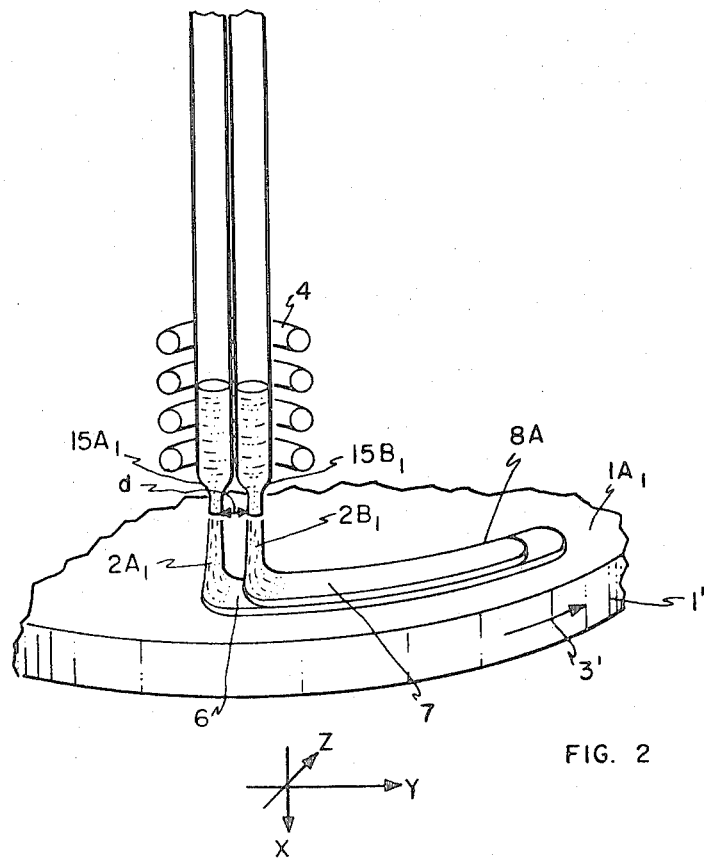
FIG. 2 is a side-view of a portion of apparatus that is a modification of the apparatus of FIG. 1.

Turning now to FIG. 2, the moving surface labeled $1A_1$ is a flat surface of a moving solid 1 that is capable of heat extraction, moving in the direction of the arrow shown at 3'. Two nozzles $15A_1$ and $15B_2$ are heated by a coil 4 (typically, as shown in FIG. 1, the nozzles are independently heat controlled). A first melt $2A_1$ is deposited from a first delivery orifice at the lower-most end of the nozzle $15A_1$ upon the fast moving surface $1A_1$ to effect quenching and solidification thereon and form a first solid layer 6 in ribbon form. Simultaneously, a second melt $2B_1$ is deposited from a second delivery orifice at the lower-most end of the nozzle $15B_1$, which is physically separated or spaced by an adjustable small distance d from the first orifice in the direction of movement of the first solid layer 6 (i.e., in the direction of motion of the surface $1A_1$), upon the first solid layer 6 to effect quenching of the second melt $2B_1$ and form a second layer 7 upon the first solid layer 6 to provide a multi-layered solid structure 8A. Typically, the second melt $2B_1$ differs from the first melt $2A_1$. It is shown below that the materials of great interest at present are semiconductors which are almost always brittle in solid form and mechanically quite unstable in ribbon form. The present inventors have found that a mechanically stable ribbon structure can be formed by making the first solid layer 6 of the multi-layered solid structure 8A structures using GaAs can be prepared in the same way. The solid layer 6 usually (but not always) is selected to have significantly lower melting temperature than the subsequent layer (or layers) of structure 8A, so that effective heat extraction can be achieved.

In addition to the above material types, the brittle material can be an active layer such as a semiconductor and the ductile substrate a material which forms a rectifying contact with the semiconductor layer, e.g., Si—Al. The supporting ductile substrate here and in the other examples herein can have a thickness, for example, in the range from about 10 to 100 micrometers and the active layer can range from 10 to 100 micrometers in thickness; the width of the ribbon, thus formed, typically ranges from one millimeter to several centimeters. Also, a two-layered structure can be made which is temperature sensitive, e.g., copper-constantan.

Emphasis above is on the use of the underlying layer 6 as a ductile substrate to hold and render mechanically stable a brittle layer 7. The layer 6 is also chosen to be compatible with the layer 7. It has been found, however, that cooling in the range of $10^3$–$10^{9°}$ C./second is sufficiently fast so that very little migration occurs from the layer 6 to the layer 7. A most important facet of the underlying layer is that it isolates the layer 7 from the surface $1A_1$ in FIG. 2 during solidification of the second melt $2B_1$ so that the solid layer 7 is not subject to structure effects occasioned by the surface $1A_1$. The latter facet of the invention can be used to provide a single layer 7 or a multi-layered structure consisting of the layer 7 and one or more further layers, the layer 6, in this instance, being a metal which is a liquid at the temperature of the surface $1A_1$ and remains liquid. In this operation, the first deposited liquid prevents any adverse effect of the moving heat sink surface on the solidifying active layer or layers.

Further modifications of the invention herein dis-

8. A multi-layered ribbon as claimed in claim 1 in which the active layer is a superconductor.

9. A multi-layered ribbon as claimed in claim 8 in which the superconductor is brittle and in which the substrate is ductile.

10. A multi-layered ribbon as claimed in claim 1 wherein the active layer is a magnetic material.

11. A multi-layered ribbon as claimed in claim 10 wherein the magnetic material is taken from the group consisting essentially of the type $R_{1-x}M_x$, where $R$ = a rare earth and $M$ = a transition metal and $0 < X < 1$.

* * * * *